(12) United States Patent
Graupera et al.

(10) Patent No.: US 8,633,452 B2
(45) Date of Patent: Jan. 21, 2014

(54) METHODS AND STRUCTURES FOR RAPID SWITCHING BETWEEN DIFFERENT PROCESS GASES IN AN INDUCTIVELY-COUPLED PLASMA (ICP) ION SOURCE

(75) Inventors: Anthony Graupera, Hillsboro, OR (US); Sean Kellogg, Portland, OR (US); Mark W. Utlaut, Scappoose, OR (US); N. William Parker, Hillsboro, OR (US)

(73) Assignee: FEI Company, Hillsboro, OR (US)

( * ) Notice: Subject to any disclaimer, the term of this patent is extended or adjusted under 35 U.S.C. 154(b) by 370 days.

(21) Appl. No.: 13/182,187

(22) Filed: Jul. 13, 2011

(65) Prior Publication Data

US 2013/0015765 A1 Jan. 17, 2013

(51) Int. Cl.
*H01J 27/00* (2006.01)

(52) U.S. Cl.
USPC ............... 250/423 R; 250/430; 315/111.51; 315/111.81; 315/111.21; 118/723 R

(58) Field of Classification Search
USPC .......... 250/423 R, 424, 430, 492.21, 492.3; 118/723 R, 723 E, 723 I; 216/67, 68; 204/298.07, 298.33; 315/111.21–111.91; 156/345.33
See application file for complete search history.

(56) References Cited

U.S. PATENT DOCUMENTS

| | | | |
|---|---|---|---|
| 4,737,637 A | 4/1988 | Knauer | |
| 4,755,685 A | 7/1988 | Kawanami et al. | |
| 4,789,787 A | 12/1988 | Parker | |
| 4,873,445 A * | 10/1989 | Le Jeune | 250/423 R |
| 5,165,954 A | 11/1992 | Parker et al. | |
| 5,188,705 A | 2/1993 | Swanson et al. | |
| 5,438,205 A * | 8/1995 | Schroeder | 250/423 R |
| 7,166,233 B2 | 1/2007 | Johnson et al. | |
| 7,173,252 B2 * | 2/2007 | Mack | 250/423 R |
| 7,241,361 B2 | 7/2007 | Keller et al. | |
| 7,670,455 B2 | 3/2010 | Keller et al. | |
| 7,952,083 B2 | 5/2011 | Shichi et al. | |
| 8,076,650 B2 | 12/2011 | Smith et al. | |
| 8,168,957 B2 | 5/2012 | Keller et al. | |
| 8,253,118 B2 | 8/2012 | Zhang et al. | |
| 2012/0056088 A1 | 3/2012 | Rue | |
| 2012/0091360 A1 | 4/2012 | Zhang et al. | |
| 2012/0280136 A1 | 11/2012 | Zhang et al. | |

OTHER PUBLICATIONS

C.D. Coath, et al., "A high-brightness duoplasmatron ion source for microprobe secondary-ion mass spectrometry," Rev. Sc. Instrum., Feb. 1995, pp. 1018-1023, vol. 66, No. 2.

* cited by examiner

*Primary Examiner* — Haissa Philogene
(74) *Attorney, Agent, or Firm* — Scheinberg & Associates, PC; Michael O. Scheinberg; John B. Kelly

(57) ABSTRACT

An openable gas passage provides for rapid pumpout of process or bake out gases in an inductively coupled plasma source in a charged particle beam system. A valve, typically positioned in the source electrode or part of the gas inlet, increases the gas conductance when opened to pump out the plasma chamber and closes during operation of the plasma source.

19 Claims, 9 Drawing Sheets

METHODS AND STRUCTURES FOR RAPID SWITCHING BETWEEN DIFFERENT PROCESS GASES IN AN INDUCTIVELY-COUPLED PLASMA (ICP) ION SOURCE

TECHNICAL FIELD OF THE INVENTION

The present invention relates to methods and structures enabling rapid switching between different process gases when using an inductively-coupled plasma (ICP) ion source in a focused ion beam (FIB) system.

BACKGROUND OF THE INVENTION

Focused ion beam systems are used in a variety of applications in integrated circuit manufacturing and nanotechnology to create and alter microscopic and nanoscopic structures. Focused ion beams can use a variety of sources to produce ions. Liquid metal ion sources can provide high resolution, that is, a small spot size, but typically produce a low current and are limited in the types of ions available. The different ion species have different properties, which make some ion species more preferable than others for specific applications. For example, whereas helium ions are useful for imaging or light polishing, xenon ions provide higher milling rates that are useful for bulk processing. Plasma ion sources can produce ions of many different species and at larger currents, but often cannot be focused to as small a spot.

Plasma ion sources ionize gas in a plasma chamber and extract ions to form a beam that is focused on a work piece. Many different types of gases can be used in a plasma ion source to provide different species of ions. As ions are extracted from the plasma source to form the beam, the gas in the plasma must be replenished to maintain the plasma. Typically a gas inlet for a plasma ion source has a small opening through which gas is supplied to maintain the pressure in the plasma chamber. Because the gas is used very slowly, the small opening to replenish the gas is very small. When a user desires to change the gas in the plasma chamber to form a beam from a different ion species, it can take up to 30 minutes to remove one gas and fill the chamber with a second gas. This is an unacceptably long time for many applications that process a work piece sequentially using different process gases.

FIG. 1 shows a typical prior art inductively coupled plasma source 100 for use with a focused ion beam system such as the one described in U.S. patent application Ser. No. 12/373,676 for a "Multi-source Plasma Focused Ion Beam System," which is assigned to the assignees of the present application and is hereby incorporated by reference. Gas is provided to a plasma chamber 102 within a source tube 103 from an external gas feed line 104 through a gas filter 106 and then to a capillary tube 108 with a flow restriction 110. Energy is fed into the plasma chamber 102 from RF power supply 113 by antenna coils 114 and ions are extracted through a source electrode aperture 116 in a source electrode 118 by extractor electrode 120. The gas conductance into and out of the plasma chamber 102 is through the flow restriction 110 in the capillary tube (at the top of the source tube 103) and the aperture 116 (typically 175 µm in diameter) in the source electrode 118. Pump 122 connected to gas supply line 104 through valve 123 removes gas from plasma chamber 102 through capillary 108 and gas supply line 104. An ion column pump (not shown) extracts gas from plasma chamber 102 through source electrode aperture 116. Multiple gas sources such as gas storage 130A, gas storage 130B, gas storage 130C and gas storage 130D supply gas into gas supply line 104. A beam voltage supply 132 supplies a high voltage to the plasma in chamber 102 and an extraction voltage supply 134 supplies a voltage to extraction electrode 120. Extracted ions or electrons are focused by focusing electrode 136. Additional details of the focusing column and sample chamber are not shown.

To remove a gas from the interior of the plasma chamber, the gas feed line 104 itself may be pumped as shown to remove gas in the source tube above the flow restriction 110 in the capillary tube 108. The volume of the FIB system below the source electrode 118 may also be adequately pumped using the main chamber vacuum pump(s) (not shown).

Because both the source electrode aperture 116 and the flow restrictor 110 have small diameters and correspondingly very low gas conductances, it is impossible to rapidly pump out the interior of the source tube 103. This is a disadvantage, especially for a production FIB system. First, it may take a much longer time to pump out a first process gas from the source tube 103 before the base pressure is low enough to introduce a second process gas. Insufficient purging of the gas can lead to contamination of the plasma through ionization Second, it may take a long time, during bakeout, to pump away contaminants which are thermally desorbed from the interior walls of the source tube 103.

What is needed is an ion source for a focused ion beam system that provides for rapid changes of gas.

SUMMARY OF THE INVENTION

An object of the invention is to provide a method and apparatus for allowing the rapid changing of process gases or purging of contamination in a plasma source for a focused ion beam column.

In accordance with a preferred embodiment, the plasma ion source includes a switchable gas conductance so that the conductance can be optimized at a low level for operation and then increased to allow rapid switching of the gas in the plasma chamber. A valve opens an alternate gas path for rapid removal of the gas in the plasma chamber and then closes off the alternate gas path for normal operation.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings, in which.

DETAILED DESCRIPTION OF PREFERRED EMBODIMENTS

The present invention comprises several methods and corresponding structures to enable relatively rapid switching between process gases in an ICP ion source.

A preferred system has two selectable configurations: 1) a plasma generation configuration in which the pumping speed is low, and 2) a source tube pump-out configuration in which the pumping speed is much higher, enabling the source tube to be pumped out into either the main vacuum chamber or the gas feed manifold in a matter of seconds. Embodiments of the invention provide an alternate gas path and a moveable structure to expose or seal the alternate gas path. By "alternate gas path" is meant a gas path that is not through the source electrode aperture or the inlet flow restrictor, This is accomplished in some embodiments by a modification to the ICP ion source in which either the source electrode functions as a gas vent or the capillary assembly functions as a poppet valve. By poppet valve is meant a valve that displaces axially, that is, perpendicular to a hole that is uncovered by the valve. Some embodiments employ a source electrode structure that can bias the plasma and also include sealable holes to act as a gas vent valve for the interior of the plasma chamber. In other embodiments, a vertically-moveable capillary assembly mounted within a plasma chamber functions as a moveable structure to open or close venting passages. Either of these embodiments may be implemented in a prior art ion source with minimal additional cost or complication.

In an embodiment in which the gas is pumped out from the plasma chamber through the main vacuum chamber, one or more holes in the source electrode or in a structure at the same end of the plasma chamber as the source electrode, is sealed by a moveable structure for normal plasma chamber operation. To create a seal during times of plasma production, the source electrode in some embodiments is modified to contain a guide ring upon which a moveable structure may sit. In addition to the guide ring, the source electrode can have through holes to provide the desired alternative function of a vent valve.

In other embodiments, a valve including moveable structure at the same end of the plasma chamber as the gas inlet moves to expose or seal a gas path to a gas line pump. The moveable structure preferably includes the capillary assembly through which gas enters the chamber during normal operation. In several embodiments, the seal between the moveable member and the source electrode or other portion of the plasma chamber can be achieved using a labyrinth seal, an o-ring seal, or other seal.

Figure 1:
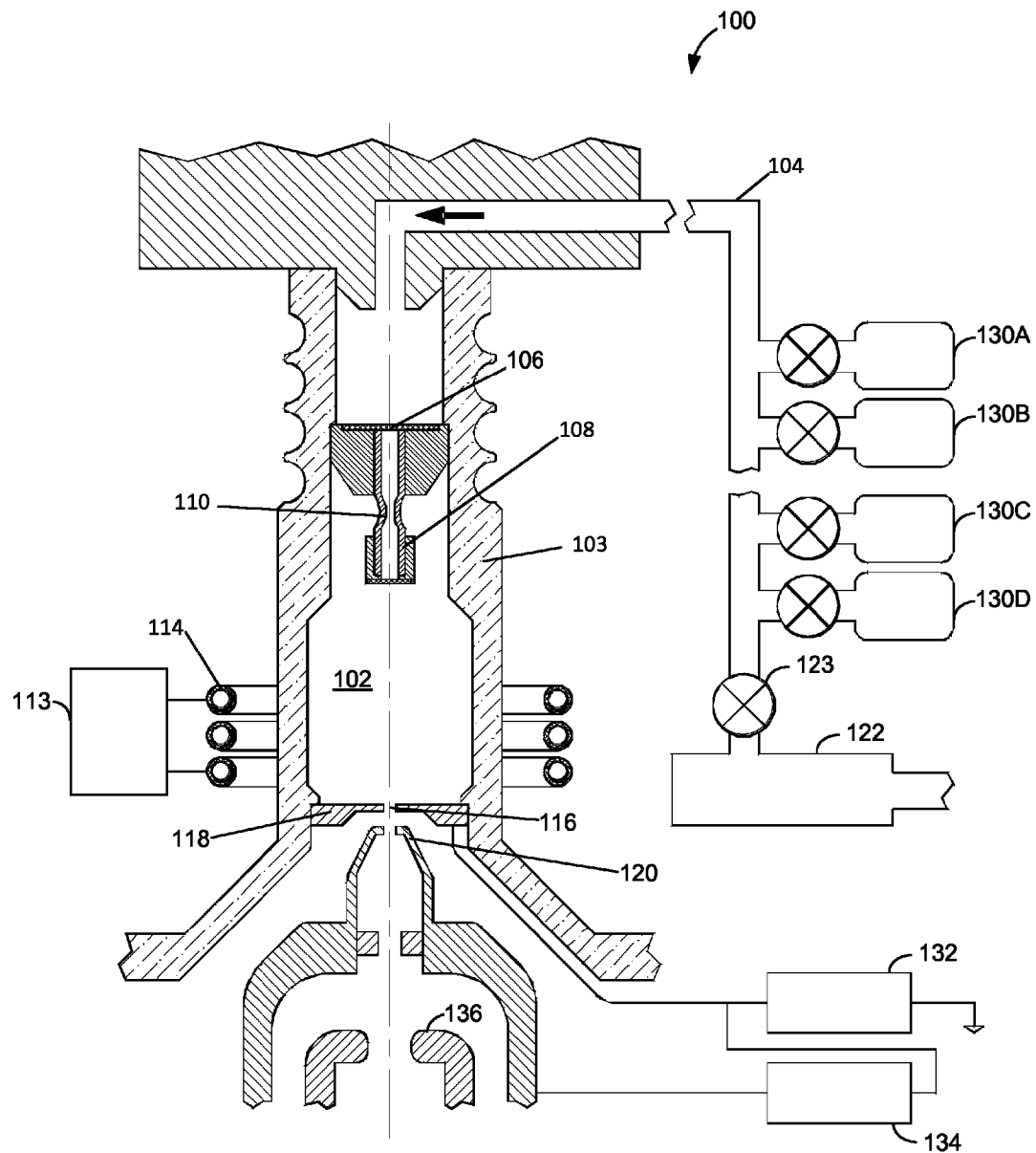
FIG. 1 shows a prior art Inductively-coupled Plasma (ICP) Ion Source having fixed source electrode and gas capillary tube.
Figure 2:
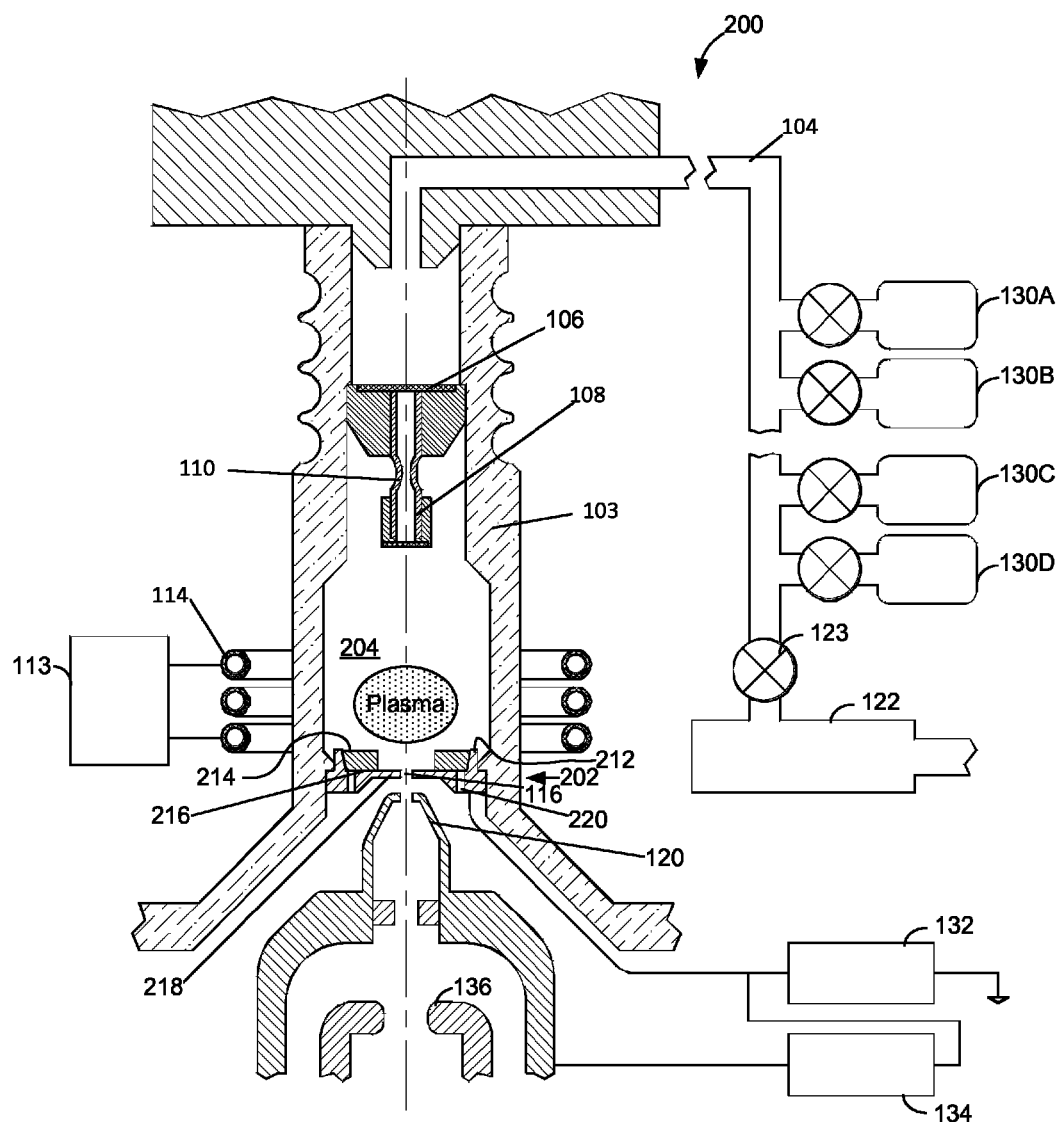
FIG. 2 shows an embodiment of an ICP source of the present invention having a moveable structure in the closed (down) position.
Figure 3:
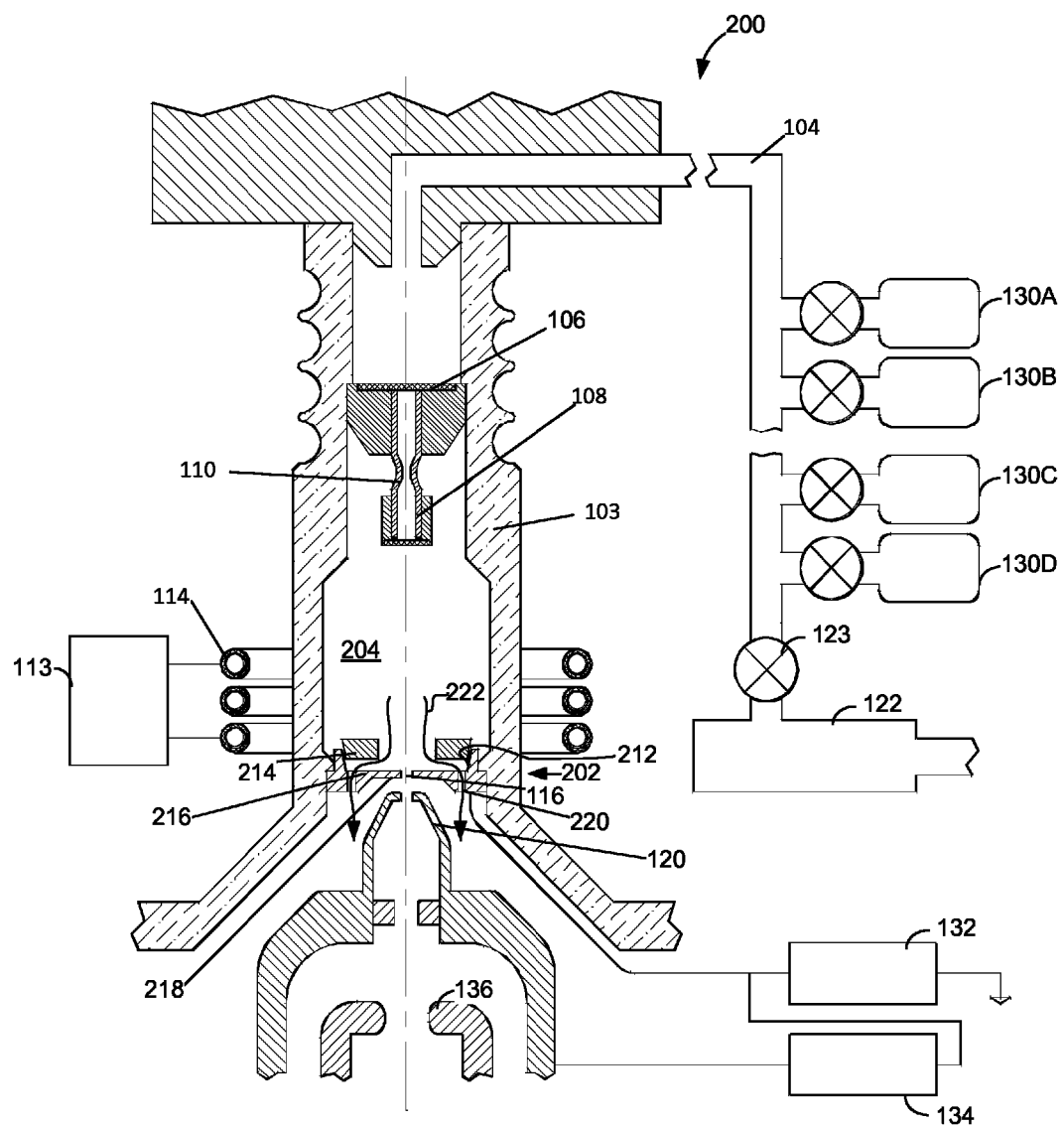
FIG. 3 shows the ICP source of FIG. 2 having a moveable structure in the open (up) position.

FIGS. 2 and 3 show a plasma source 200 having a valve 202 that selectively increases the gas conductance for purging a plasma chamber 204, or decreases the gas conductance for operating with a plasma in the plasma chamber 204. FIG. 2 shows the plasma source 200 with the valve 202 closed, that is, in the operating position. FIG. 3 shows the plasma source 200 with the valve 202 open, that is, in the position for rapidly pumping gas out of the plasma chamber 204. A circular guide ring 210 with an angled "lead" guides a moveable structure 214 or poppet valve down to the upper (sealing) surface 216 of the source electrode 218, which now has multiple through holes 220 leading from the interior of the source tube 103 to the chamber below the source electrode 218. In FIG. 2, the moveable structure 214 is positioned in contact with the upper surface 216 of the source electrode, providing an adequate seal to maintain the required gas pressure within the source tube 103 for plasma generation. Since the gas pressure in the plasma chamber 204 is generally less than 1 Torr (1.3 mbar), and the chamber pressure below the source electrode 218 is orders of magnitude lower, there is very little gas pressure on either side of the moveable structure 214, and in any case, what residual gas pressure exists will tend to push down on the moveable structure 214 making a better seal against surface 216.

FIG. 3 shows plasma source 200 with moveable structure 214 in its upper position, uncovering the through holes 220 in the source electrode 218. Raising moveable structure 214 provides additional gas conductance from the plasma chamber 204 to the main chamber since the additional conductance through holes 220 is much higher than the conductance of the center hole 116 in the source electrode 218 (not shown to scale in FIGS. 1-8). Arrows 222 show the gas flow through holes 220 and into the ion focusing column for removal by the system vacuum pump. Several different methods may be used for moving the moveable structure 214. In some embodiments, the device uses electrostatic repulsion of the moveable structure 214 from the source electrode 218 due to the application of a high voltage from beam voltage supply 132 and/or the extraction voltage supply 134. In another embodiment, magnetic attraction upwards may be used due to induced eddy currents in the moveable structure 214 arising from the RF magnetic fields emanating from the RF antenna 114. These eddy currents are then attracted upwards along the B-field gradient (toward higher B-fields). In yet another embodiment, a push rod may be used to mechanically lift and lower the moveable structure 214. As the push rod (not shown) extends upwards from the chamber volume below the source electrode 218 and passes through an opening in the plasma chamber 204, it will exert an upward force on the moveable structure 214, thereby lifting it off the source electrode 218 to the open position illustrated in FIG. 3.

Although FIG. 3 shows the moveable structure lifted up uniformly, i.e., still oriented horizontally as it was in FIG. 2, all that is necessary for adequate pumping is for the moveable structure to be lifted up, and a tilting mechanism will work as well as a vertical lift mechanism, just as long as the vacuum seal between the bottom surface of the moveable structure 214 and the upper surface 216 of the source electrode 218 is broken. Also note that there is no requirement for precisely locating the moveable structure 214 since it has no optical function—precise alignment of the hole 116 in the (fixed) source electrode 218 is still required as it was for the prior art ICP ion source 100 in FIG. 1. If the source electrode 218 is brazed or permanently attached to the plasma chamber, then the moveable structure 214 must already be inside the plasma chamber 204 prior to brazing (i.e., loose inside). The hole does not need to be in the source electrode itself—the hole should lead to a path connecting to a vacuum pump. For example, the hole could be in an electrode support or other structure as long as the hole leads between the interior of the plasma chamber 204 and the ion optical column.

Figure 4:
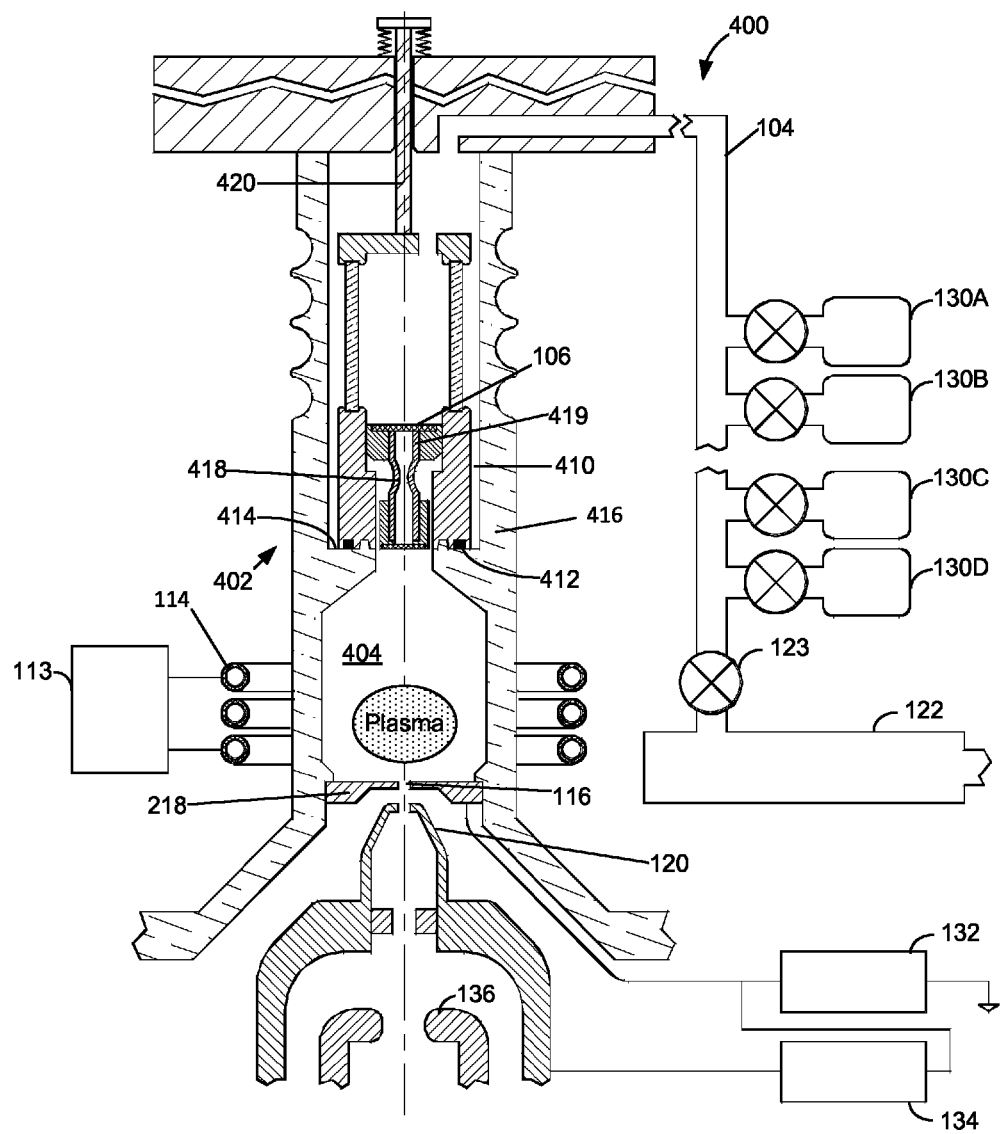
FIG. 4 shows another embodiment of an ICP source of the present invention having a capillary assembly pushed down to enable gas feed to the source tube of the ICP ion source and an o-ring 402 sealing the capillary assembly.
Figure 5:
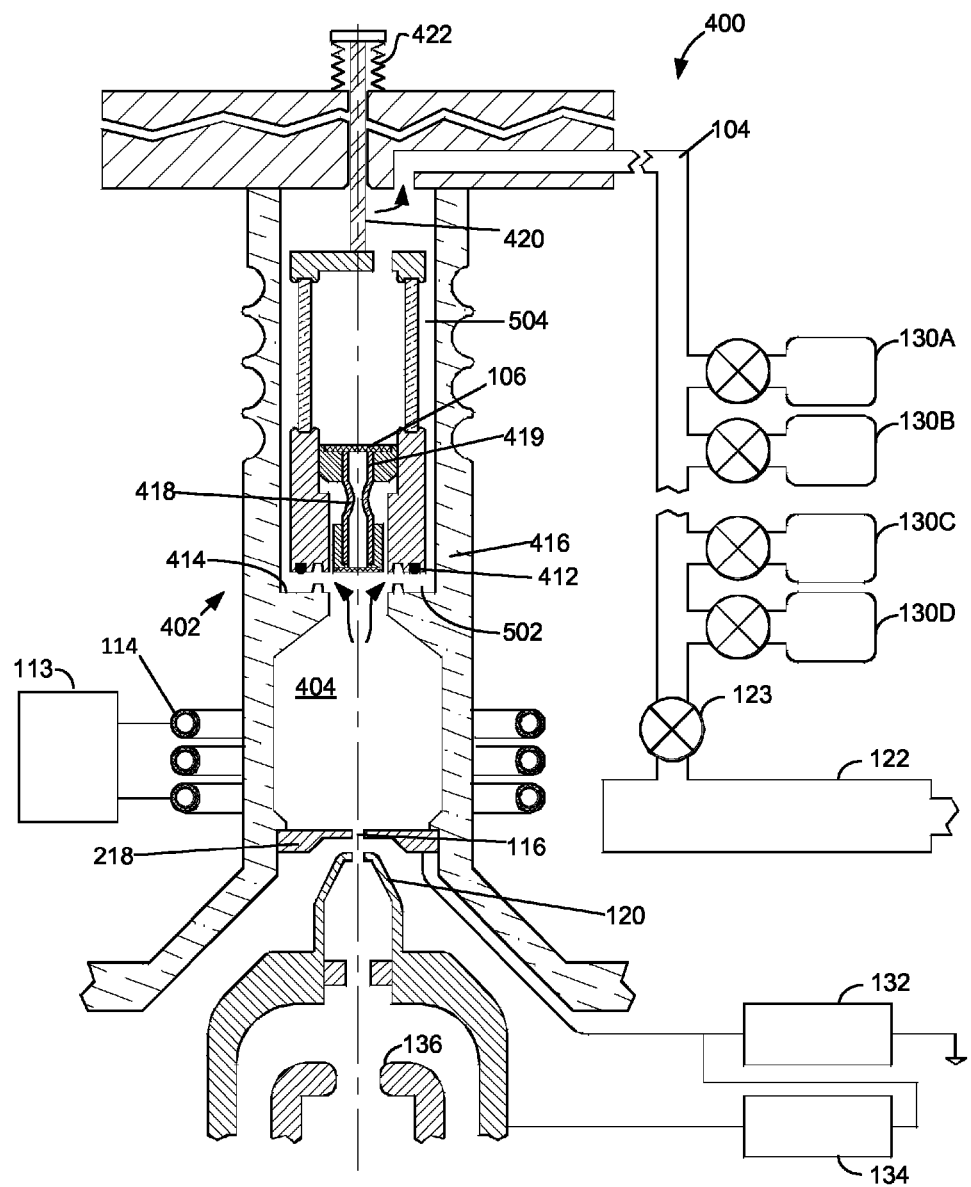
FIG. 5 shows the ICP source of FIG. 4 having a capillary assembly pulled up to enable pumping out of the source tube and gas feed manifold.

FIGS. 4 and 5 show another embodiment comprising a plasma source 400 having a valve 402 that selectively increases the gas conductance for purging a plasma chamber 404 or decreases the gas conductance for operating with a plasma in the plasma chamber 404. FIG. 4 shows the plasma source 400 with the valve 402 closed, that is, in the operating position. FIG. 5 shows the plasma source 400 with the valve 402 open, that is, in the position for rapid pumping gas out of the plasma chamber 404. The arrows show the flow of gas out of the plasma chamber 404 for purging.

In the embodiment of FIG. 4, the gas is vented through the same end of the plasma chamber 404 from which the gas enters by moving a capillary assembly 410 upwards to open a gap 502 surrounding the capillary assembly 410 as illustrated in FIG. 5. In FIG. 4, the valve 402 is shown closed, with capillary assembly 410 positioned and sealed against an o-ring 412 on a counterbore 414 in plasma tube 416 to seal the capillary assembly. With the capillary assembly 410 in this lower position, the plasma chamber 404 can be filled with the process gas through the flow restriction 418 in the capillary tube 419 in capillary assembly 410. RF power is then applied by RF power supply 113 to the RF antenna 114 to excite plasma within the plasma chamber 404. A rod 420 is attached to capillary assembly 410 to lift o-ring 412 off of counterbore 414. Actuation of valve 402, that is, lifting of capillary assembly 410, may be performed manually, or using a solenoid, pneumatic actuator, or other means. A bellows 422 seals the portion of rod 420 that extend from interior regions of the source.

In FIG. 5, the capillary assembly 410 is shown being mechanically pulled up to open a circular vent channel 504 around the capillary assembly through which process gases and desorbed gas (during bakeout) may pass upwards from the source tube interior, through gap 502, to eventually be pumped out through the gas feed/pump-out line 104 through valve 123 by pump 122 as shown. Some gas is also pumped through the hole 116 in the source extractor electrode 218 and out of the system by the column pump system (not shown).

Figure 6:
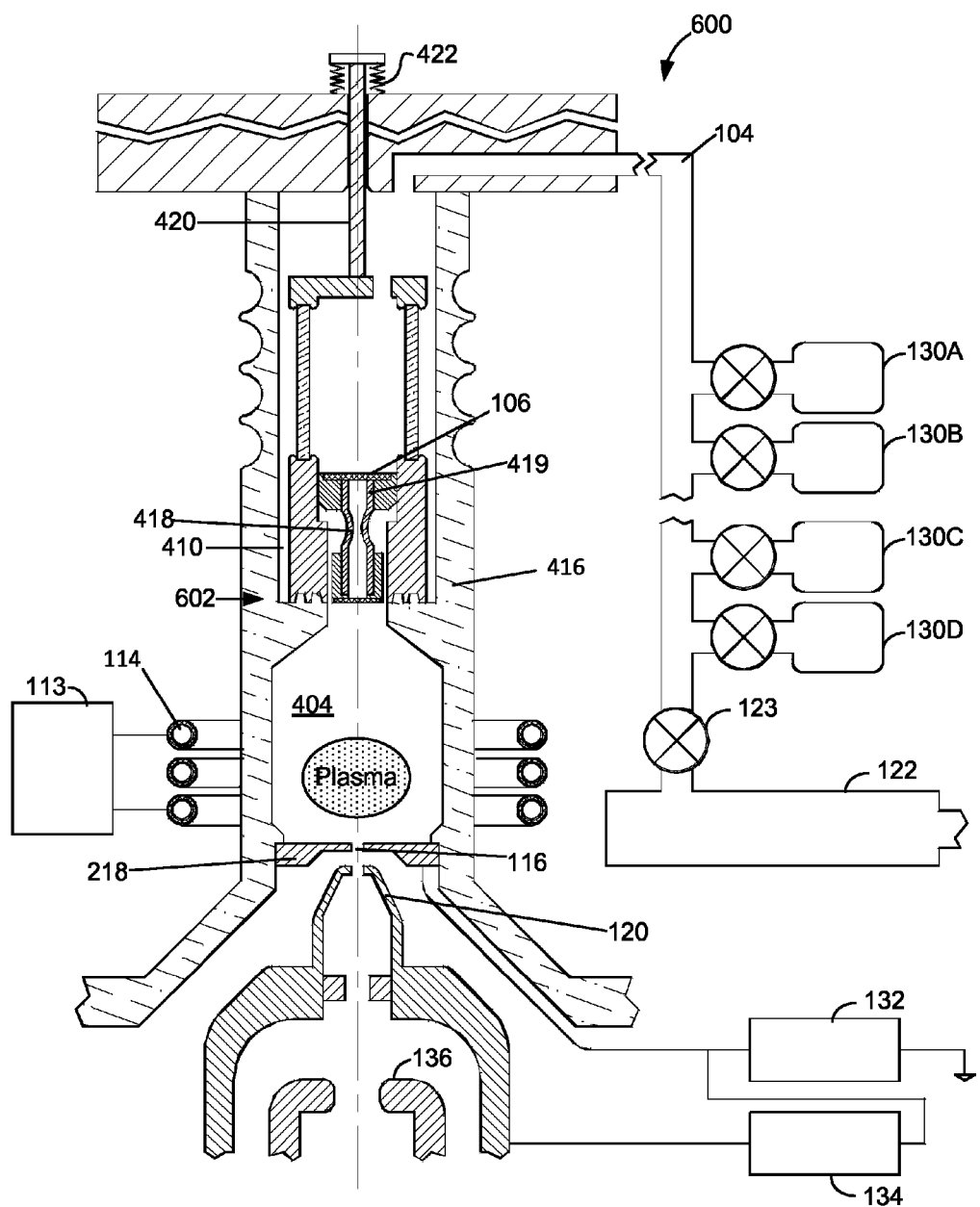
FIG. 6 shows another embodiment of an ICP source of the present invention having a capillary assembly with a labyrinth seal.

FIG. 6 shows a charged particle beam system having a plasma source 600, similar to that of FIG. 5, but employing a labyrinth seal 602 between the capillary assembly 410 and the source tube 416, instead of an o-ring. A labyrinth seal 602 eliminates the o-ring, which can suffer chemical or mechanical damage which can cause leakage into the source tube 416 during plasma generation. A labyrinth seal 602 may allow more gas leakage because the contact surfaces of the capillary assembly 410 and the plasma source tube 416 are harder than o-rings. Because labyrinth seal 602 seals between the environment of gas supply line 104 and the plasma chamber 404, a leak in the valve is acceptable if it is small compared to the gas flow through the flow restrictor 418. If desired, the small amount of gas leakage through labyrinth seal 602 can be calibrated and the size of flow restrictor 418 adjusted to compensate, so that the total conductance between gas supply line 104 and plasma chamber 404 remains the same. In some embodiments, capillary tube 419 can be eliminated, and all gas can enter the plasma chamber through the calibrated labyrinth seal.

Figure 7:
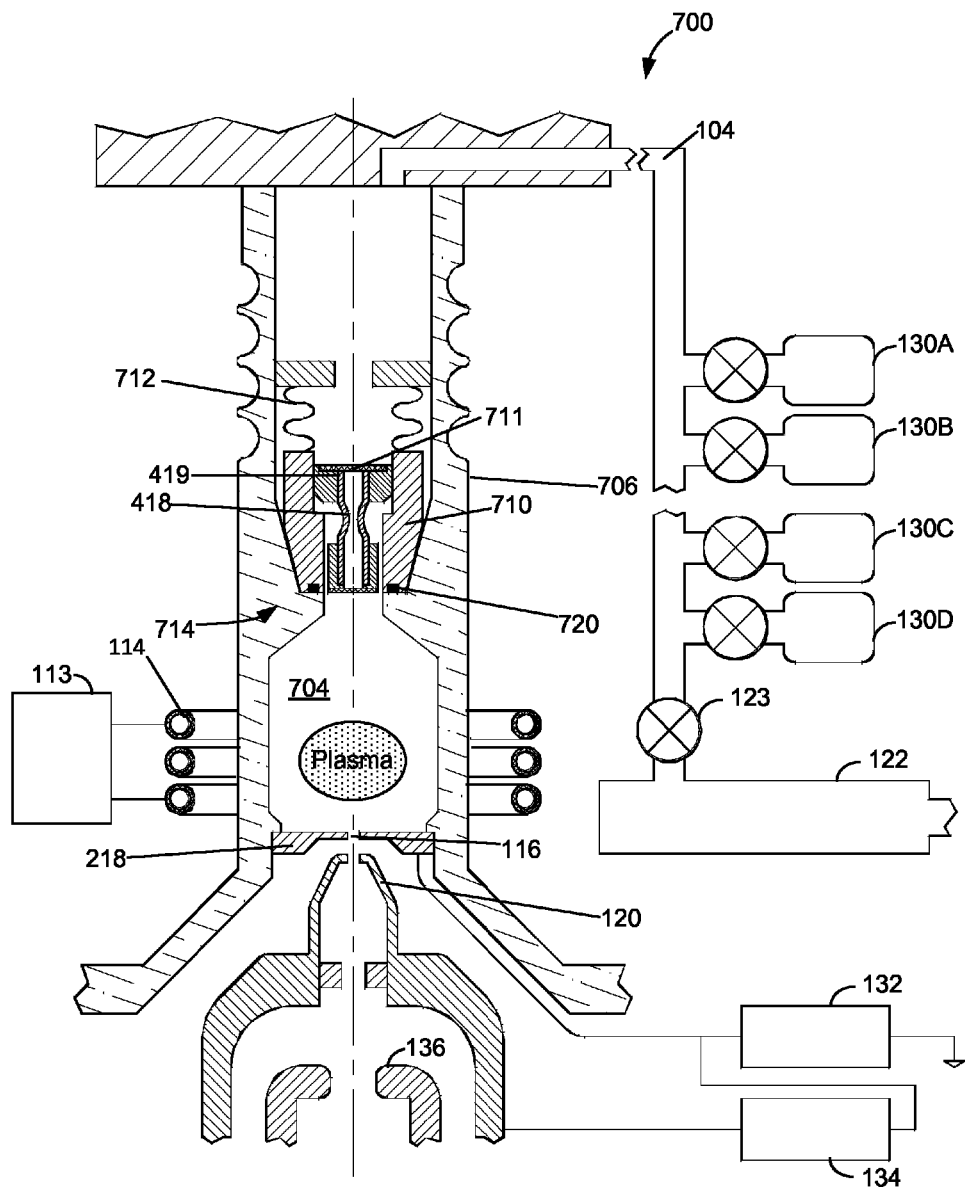
FIG. 7 shows another embodiment of an ICP source of the present invention having a modified source tube and capillary assembly to be sealed by an o-ring or labyrinth.
Figure 8:
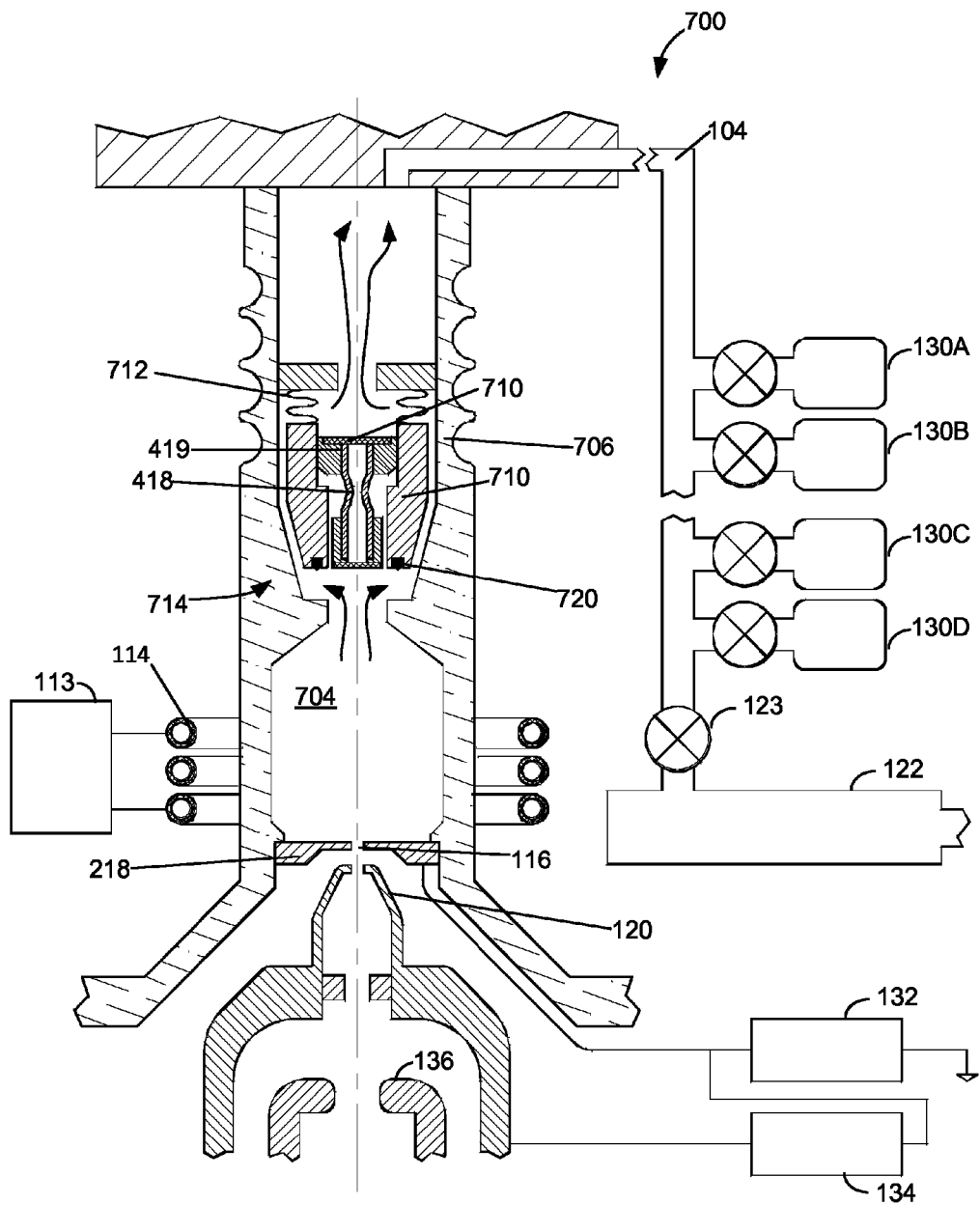
FIG. 8 shows the ICP source of FIG. 7 having a retracted capillary assembly to enable pumping out of the source tube and gas feed manifold.

FIGS. 7 and 8 illustrate the two operating modes of a third embodiment of the invention—FIG. 7 shows the FIB system configured for plasma generation, while FIG. 8 shows the same FIB system configured for rapid pump out of the source tube. For this third embodiment, as for the second embodiment, the plasma chamber 704 is pumped out through the end of the plasma tube 706 at which the gas enters. In this case, a capillary tube assembly 710 automatically positions itself in either the upper or lower position, depending on the operating mode. During pumpout, a spring 712 lifts capillary assembly 710 off of source tube 706 opening a seal 714. For plasma generation (FIG. 7), the capillary tube assembly 710 is pressed downwards against the spring force by the process gas, which is typically at pressures >200 Torr (270 mbar) above the capillary tube assembly 710. In the example shown, an o-ring 720 is used to seal the capillary assembly 710 against the source tube 706. A labyrinth seal as shown in FIG. 6 or other type of openable and closable seal may be employed. The source tube 706 and the capillary assembly 710 have mating conical surface such that the capillary assembly 710 sits flush with the source tube 706 when the assembly 710 is in the lower position. This configuration guides the capillary assembly 710 onto the seal 714 further creating a seal between the conical surfaces of source tube 706 and capillary assembly 710 and preventing unwanted leaks from the source tube chamber 704. During plasma operation, the process gas passes through filter 711, then into capillary tube 419 with flow restrictor 418.

As shown in FIG. 8, to pump out the gas from the plasma chamber 704, the process gas pressure is turned off by switching off the valves on gas supplies 130A through 130D, and the pump-out valve 123 is opened. As a result, the combined force of the pull-up spring and the gas pressure within the plasma chamber causes the capillary assembly 710 to move up, breaking the lower seal 714, and enabling the plasma chamber 704 to be evacuated of process gas when switching gases or to be evacuated of desorbed gases during bake out. Some gas is also pumped out of plasma chamber 704 through aperture 116 in source electrode 218. In other embodiments, other moveable structures can uncover other paths between the interior of plasma chamber 704 and gas supply line 104. For example, a path next to the gas inlet could be opened and closed by a moveable structure other than the capillary assembly.

Figure 9:
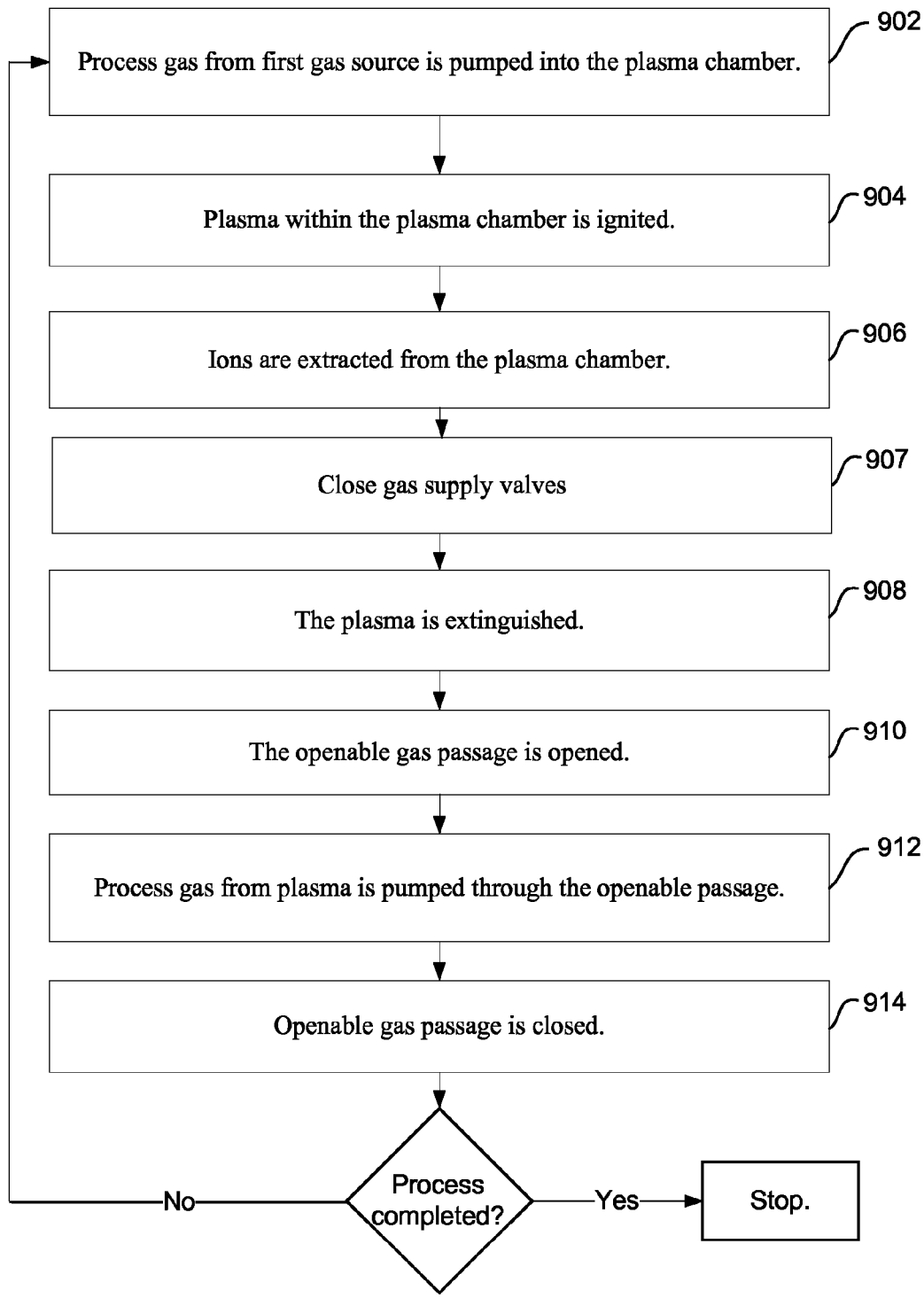
FIG. 9 shows a flow chart showing the method of evacuating a process gas from an ICP ion source system.

FIG. 9 shows a flow chart which describes a method for using a preferred embodiment to evacuate a process gas from an ICP ion source system. Beginning with step 902, a first process gas is supplied to the plasma chamber by opening a valve of a gas supply. In step 904, the plasma located within the plasma chamber is ignited. Upon ignition, in step 906, ions are extracted from the plasma chamber. After the ions have been extracted, the gas supply valve is closed in step 907 and the plasma is extinguished in step 908. In step 910, the openable gas passage is opened to evacuate the chamber of the first process gas. The first gas is pumped out in step 912. After completely evacuating the process gas, the openable gas passage is closed. If, after step 914, the process has completed, then work stops. Otherwise, a new process gas may now be introduced into the plasma chamber, as in step 902. The new process may be the first process gas, or a second process gas which may differ from the first process gas. The openable gas valve is also opened during bake-out to speed removal of contaminants. The openable gas valve connects the interior of the plasma chamber to a pump through a path having a gas conductance higher than that of either the source aperture or gas inlet restrictor. The pump preferably can evacuate the plasma chamber in less than 15 minutes, more preferably in less than 10 minutes and most preferably in less than 5 minutes.

While specific locations and seals for alternate gas paths have been described as examples, the invention is not limited to any particular location for the alternate gas path or any particular type of device to expose and seal the alternative gas path. Moreover, the invention is not limited to a plasma ion source, but can also apply to, for example, a plasma electron source.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. An inductively-coupled plasma ion source, comprising:
   a plasma chamber for maintaining a plasma;
   a gas line conduit for providing gas to the plasma chamber;
   an aperture through which ions are extracted from the plasma chamber; and
   a valve for selectively increasing the gas conductance from the plasma chamber, the valve being placed in a first position during operation and being in a second position for more rapidly removing gas from the plasma chamber.

2. The inductively-coupled plasma ion source of claim 1 in which the valve comprises a closeable opening at the same end of the plasma chamber as a source electrode.

3. The inductively-coupled plasma ion source of claim 2 in which the valve comprises an opening in the source electrode that can be covered by displaceable member.

4. The inductively-coupled plasma ion source of claim 3 in which the member is displaced by an electric field or a magnetic field.

5. The inductively-coupled plasma ion source of claim 4 in which the electric field is provided by a voltage supplied by a plasma electrode voltage supply or by an extraction electrode voltage supply.

6. The inductively-coupled plasma ion source of claim 1 in which the valve comprises a closeable opening at the same end of the plasma chamber as a gas inlet.

7. The inductively-coupled plasma ion source of claim 6 in which the valve includes a moveable structure that in a first position forms a seal and that in a second position allows gas to pass into the plasma chamber.

8. The inductively-coupled plasma ion source of claim 7 further comprising a capillary tube that regulates gas entering the plasma chamber and in which the moveable structure supports the capillary tube.

9. The inductively-coupled plasma ion source of claim 6 in which a portion of the gas inlet is displaceable to seal or unseal the plasma chamber.

10. The inductively coupled plasma the ion source of claim 6 in which a gas pressure differential opposes and overcomes a biasing force to maintain the moveable structure in a sealed position during operation.

11. The inductively coupled plasma ion source of claim 10 in which the biasing force opens the valve when the plasma source is being evacuated without requiring manually moving the valve.

12. The inductively coupled plasma ion source of claim 10 in which a spring provides the biasing force.

13. The inductively coupled plasma ion source of claim 10 in which the valve includes a labyrinth seal.

14. The inductively coupled plasma ion source of claim 1 further comprising a biasing means to automatically open the valve when the plasma chamber is being pumped out.

15. A method of evacuating a process gas from an ICP ion source system, comprising:
   providing the ICP ion source system having;
      an evacuable plasma chamber;
      a gas inlet including a flow restrictor for supplying gas to the plasma chamber;
      an aperture through which ions are extracted from the plasma chamber; and
      a selectively openable gas passage from the plasma chamber, the selectively openable gas passage being other than through the flow restrictor and the aperture;
   providing a process gas from a first gas source into the plasma chamber;
   igniting a plasma in the plasma chamber;
   extracting ions from the plasma chamber through the aperture in the source electrode;
   extinguishing the plasma in the plasma chamber;
   opening the openable gas passage; and
   pumping the gas from the plasma through the openable passage.

16. The method of claim 15 further comprising, after pumping the plasma through the openable passage,
   closing the openable passage;
   providing a second process gas into the plasma chamber through the gas inlet including a flow restrictor; and
   igniting a plasma in the plasma chamber.

17. The method of claim 15 in which opening the openable gas passage comprises the uncovering of a hole in the source aperture.

18. The method of claim 15 in which opening the openable gas passage comprises the moving of the gas inlet to unseal a passage.

19. The method of claim 18 in which opening the openable gas passage comprises automatically opening the gas inlet to unseal a passage when gas is being pumped out through the gas supply lines.

* * * * *